US 11,373,838 B2
Jun. 28, 2022

(12) United States Patent
Brodie

(54) MULTI-BEAM ELECTRON CHARACTERIZATION TOOL WITH TELECENTRIC ILLUMINATION

(71) Applicant: KLA-Tencor Corporation, Milpitas, CA (US)

(72) Inventor: Alan D. Brodie, Palo Alto, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/163,263

(22) Filed: Oct. 17, 2018

(65) Prior Publication Data
US 2020/0126752 A1    Apr. 23, 2020

(51) Int. Cl.
H01J 37/10      (2006.01)
H01J 37/147     (2006.01)
(Continued)

(52) U.S. Cl.
CPC .............. H01J 37/10 (2013.01); H01J 37/06 (2013.01); H01J 37/12 (2013.01); H01J 37/147 (2013.01);
(Continued)

(58) Field of Classification Search
CPC .......... H01J 37/06; H01J 37/10; H01J 37/122; H01J 37/141; H01J 37/147; H01J 2237/04928
See application file for complete search history.

(56) References Cited

U.S. PATENT DOCUMENTS 3,101,430 A * 8/1963 Scherzer ............... H01J 29/56
                                                    250/396 R
4,625,146 A * 11/1986 Van Gorkum ........ H01J 29/566
                                                    313/414
(Continued)

FOREIGN PATENT DOCUMENTS

JP     2005174568 A    6/2005
KR     20170010917 A   2/2017
WO     2017165308 A1   9/2017

OTHER PUBLICATIONS

Van Gorkum, Aart A., "Correction of spherical aberration in charged particle lenses using aspherical foils", Journal of Vacuum Sciences Technology B 1, 1312 (1983), dio: 10.1116/1.582736, 5 pages.
(Continued)

Primary Examiner — Eliza W Osenbaugh-Stewart
(74) Attorney, Agent, or Firm — Suiter Swantz pc llo

(57) ABSTRACT

A multi-beam electron source is disclosed. The multi-beam source includes an electron source, a grid lens assembly, and a multi-lens array assembly. The multi-lens array assembly includes a set of lenses disposed across a substrate. The grid lens assembly is configured to cause a primary electron beam from the electron beam source to land on the multi-lens array assembly telecentrically. The multi-lens array assembly is configured to split the electron beam from the electron beam source into a plurality of primary electron beams. The grid lens assembly includes a first lens element and a second lens element, wherein the first lens element and
(Continued)

the second lens element are separated by a gap of a selected distance. The grid lens assembly further includes a grid element including a set of apertures, wherein the grid element is disposed within the gap between the first lens element and the second lens element.

21 Claims, 4 Drawing Sheets

(51) Int. Cl.
*H01J 37/244* (2006.01)
*H01J 37/06* (2006.01)
*H01J 37/28* (2006.01)
*H01J 37/12* (2006.01)

(52) U.S. Cl.
CPC ............ *H01J 37/244* (2013.01); *H01J 37/28* (2013.01); *H01J 2237/04928* (2013.01); *H01J 2237/121* (2013.01)

(56) References Cited

U.S. PATENT DOCUMENTS

| | | | |
|---|---|---|---|
| 2009/0026389 A1* | 1/2009 | Platzgummer | B82Y 10/00 250/492.2 |
| 2010/0320382 A1* | 12/2010 | Almogy | H01J 37/147 250/307 |
| 2011/0068276 A1 | 3/2011 | Kruit et al. | |
| 2013/0273478 A1* | 10/2013 | Sano | H01J 3/12 430/325 |
| 2017/0084424 A1 | 3/2017 | Masnaghetti et al. | |
| 2018/0226219 A1 | 8/2018 | Haynes et al. | |

OTHER PUBLICATIONS

Van Gorkum, A. A et al., "Experiments on eliminating spherical aberration in electron guns using aspherical mesh enses", Journal of Vacuum Sciences Technology A 4, 2297 (1986),dio: 10.1116/1.574067,11 pages.

International Search Report dated Jan. 22, 2020 for PCT/US2019/055077.

Verster, J. L., "On the Use of Gauzes in Electron Optics", Doctoral Thesis dated Oct. 30, 1963, Delft University of Technology.

\* cited by examiner

MULTI-BEAM ELECTRON CHARACTERIZATION TOOL WITH TELECENTRIC ILLUMINATION

TECHNICAL FIELD

The present invention generally relates to electron-beam sample characterization and, more particularly, to a multi-beam electron characterization tool with telecentric illumination.

BACKGROUND

The fabrication of semiconductor devices, such as logic and memory devices, typically includes processing a substrate such as a semiconductor wafer using a large number of semiconductor fabrication processes to form various features and multiple levels of the semiconductor devices. As semiconductor device size become smaller and smaller, it becomes critical to develop enhanced inspection and review devices and procedures. One such inspection technology includes electron beam-based inspection systems, such as, scanning electron microscopy (SEM). Grid and foil lenses have been used to reduce spherical aberrations in probe forming SEM systems. Such grids are used to obtain large area beams and focus the beams to a small point. Grids and foils have generally given way to high brightness cathodes and high-quality magnetic lenses. Further, grids and foils often degrade beam quality via scattering within a foil or lensing/blocking a portion of the beam as it passes through the grid. It would be advantageous to provide a system and method that cures the shortcomings observed in previous approaches.

SUMMARY

A multi-beam electron source is disclosed, in accordance with one or more embodiments of the present disclosure. In one embodiment, the multi-beam electron source includes an electron source. In another embodiment, the multi-beam electron source includes a grid lens assembly. In another embodiment, the multi-beam electron source includes a multi-lens array assembly, wherein the multi-lens array assembly comprises a plurality of lenses disposed across a substrate. In another embodiment, the grid lens assembly is configured to cause an electron beam from the electron beam source to land on the multi-lens array assembly telecentrically. In another embodiment, the multi-lens array assembly is configured to split the electron beam from the electron beam source into a plurality of primary electron beams. In another embodiment, the grid lens assembly comprises: a first lens element and a second lens element, wherein the first lens element and the second lens element are separated by a gap of a selected distance; and a grid element including a plurality of apertures, wherein the grid element is disposed within the gap between the first lens element and the second lens element.

A multi-beam scanning electron microscopy apparatus is disclosed, in accordance with one or more embodiments of the present disclosure. In one embodiment, the apparatus includes a sample stage configured to secure a sample. In another embodiment, the apparatus includes a multi-beam electron source assembly configured to form a plurality of primary electron beams, wherein the multi-beam electron source assembly comprises an electron source, a grid lens assembly, and a multi-lens array assembly. In another embodiment, the multi-lens array assembly comprises a plurality of lenses disposed across a substrate. In another embodiment, the grid lens assembly is configured to cause an electron beam from the electron beam source to land on the multi-lens array assembly telecentrically. In another embodiment, the multi-lens array assembly is configured to split the electron beam from the electron beam source into a plurality of primary electron beams. In another embodiment, the grid lens assembly comprises: a first lens element and a second lens element, wherein the first lens element and the second lens element are separated by a gap of a selected distance; and a grid element including a plurality of apertures, wherein the grid element is disposed within the gap between the first lens element and the second lens element. In another embodiment, the apparatus includes an electron-optical column assembly including a set of electron-optical elements configured to direct at least a portion of the plurality of electron beams onto a portion of the sample. In another embodiment, the apparatus includes a detector assembly configured to detect electrons emanating from the surface of the sample in response to one or more of the primary electron beams.

A method of scanning electron microscopy is disclosed, in accordance with one or more embodiments of the present disclosure. In one embodiment, the method includes generating a primary electron beam. In another embodiment, the method includes transmitting the primary electron beam through a first lens element. In another embodiment, the method includes transmitting the primary electron beam through a curved grid and second lens element such that the primary electron beam telecentrically lands on a multi-lens array. In another embodiment, the method includes directing a plurality of primary beamlets emanating from the multi-lens array onto a sample. In another embodiment, the method includes detecting a plurality of signal beamlets from the sample in response to the plurality of primary beamlets.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings. Referring generally to FIGS. 1 through 4, a system and method for multi-beam scanning electron microscopy with telecentric illumination is described in accordance with the present disclosure.

Figure 1:
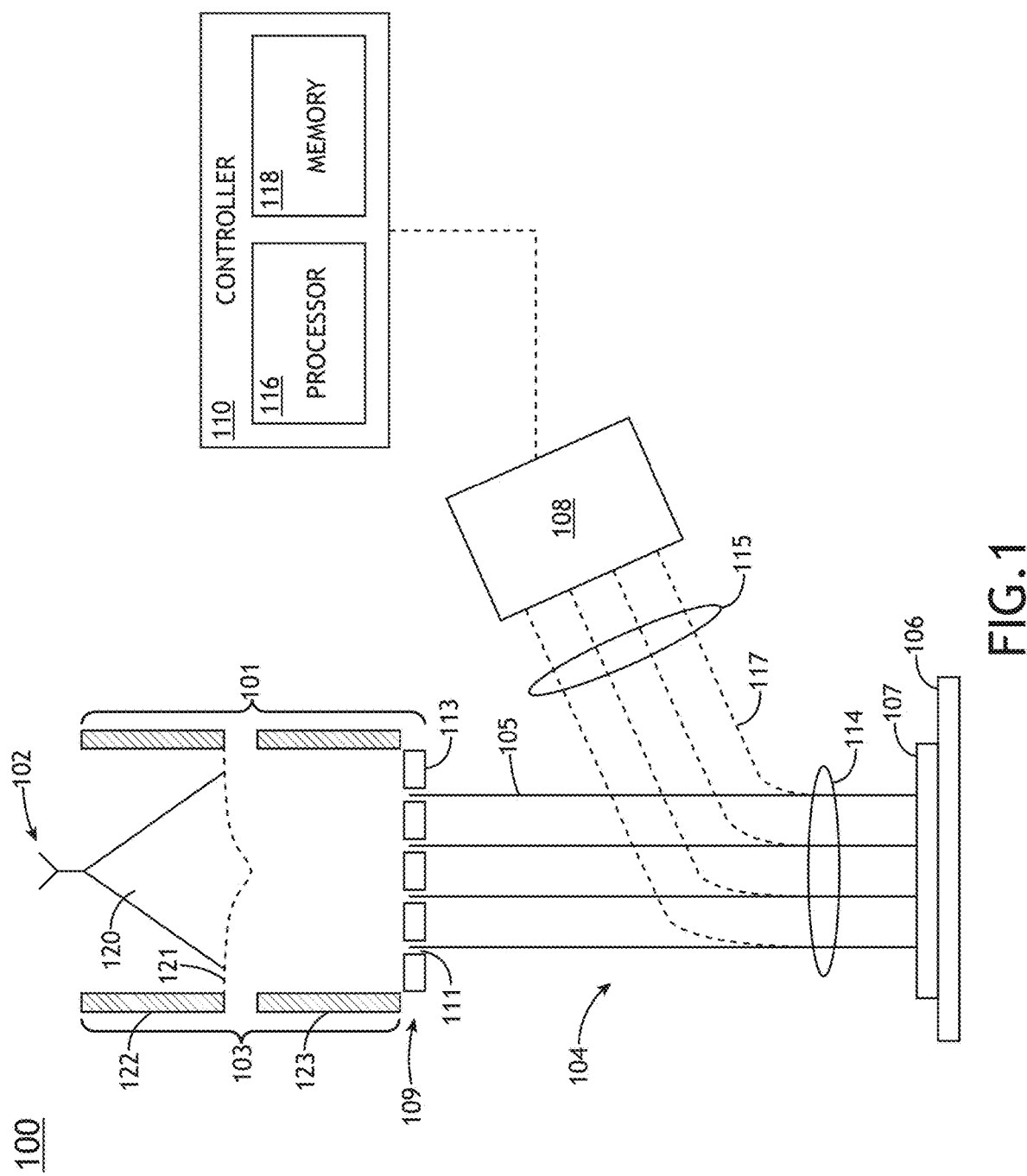
FIG. 1 is a block diagram view of a multi-beam scanning electron microscopy system with telecentric illumination within a multi-beam source, in accordance with one or more embodiments of the present disclosure.
Figure 2:
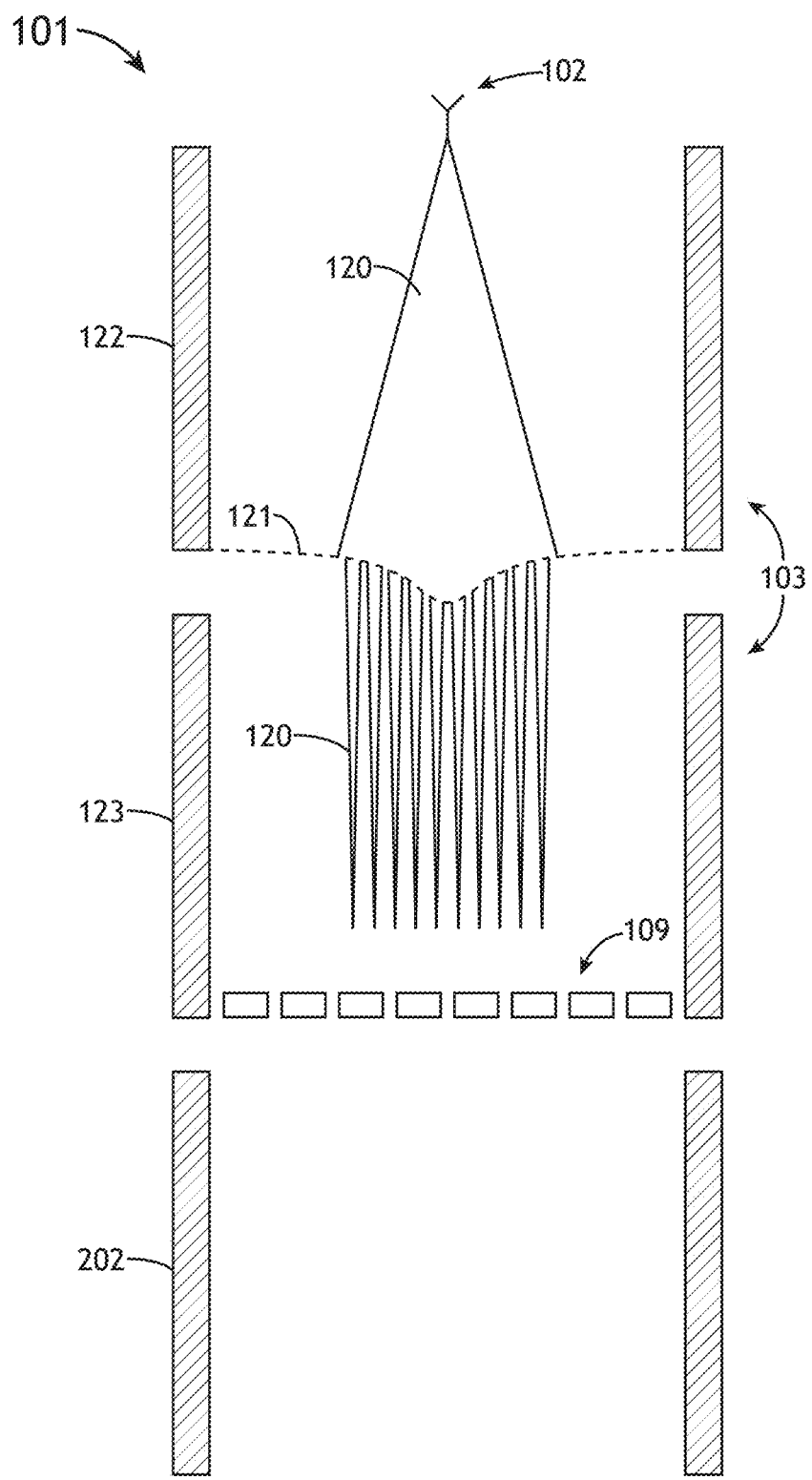
FIG. 2 is a simplified schematic view of the multi-beam source, in accordance with one or more embodiments of the present disclosure.

FIGS. 1 and 2 illustrate simplified schematic views of a multi-beam SEM system 100, in accordance with one or more embodiments of the present disclosure. In one embodiment, the system 100 includes a multi-beam electron beam source assembly 101, an electron-optical assembly 104, a sample stage 106, a detector assembly 108 and/or a controller 110.

In one embodiment, the multi-beam electron source assembly 101 includes an electron source 102, a grid lens assembly 103, and a multi-lens array assembly 109 configured to split an electron beam 120 into multiple electron beams 105. In another embodiment, the grid lens assembly 103 is configured to cause an electron beam 120 from the electron beam source 102 to land telecentrically on the multi-lens array assembly 109. In this regard, the electron beam 120 may impinge on the multi-lens array assembly 109 at normal incidence.

In one embodiment, the multi-lens array assembly 109 includes an array of lenses 111. For example, the lenses 111 may be distributed across and formed to pass through a substrate 113. It is noted that each lens 111 in the multi-lens array assembly 109 acts as a micro-lens and focuses a corresponding beamlet 105 to a small spot on the sample 107. The separation of the lenses 111 across the substrate 113 acts to separate the beams by a selected pitch.

Illumination of the lenses 111 of the multi-lens array assembly 109 is critical to preserve high resolution of each lens 111 in the multi-lens array assembly 109. It is further noted that as more and more beams are added to the system 100 the illumination area becomes significantly large such that the outermost lenses 111 cannot be illuminated with sufficient angular uniformity, resulting in a lack of uniformity in the outermost beams. The use of telecentric input illumination aids in mitigating effects caused by angular non-uniformity, thereby improving the uniformity of the multiple beams 105 across the multi-lens array assembly 109. In addition to providing normal incident illumination, the grid element 121 may mask unwanted electrons that contribute to the degradation to the beam through Coulomb or electron-electron interactions.

Referring now to FIG. 2, in one embodiment, the grid lens assembly 103 includes a first lens element 122 and a second lens element 123 separated by a gap of a selected distance. In another embodiment, the grid element 121 is positioned within the gap between the first lens element 122 and the second lens element 123. The grid element 121 may include a set of apertures formed in a substrate/plate. In one embodiment, the grid element 121 takes on a curved shape. For example, the grid element 121 may include a curved substrate/plate having a shape of a truncated Bessel function. As depicted in FIG. 2, the apex of the curved grid element 121 may have a height (h) relative to the flat outermost portions of the grid element. It is noted that the curved surface of the grid element 121 may act to create the telecentric beam 120 (incident on the multi-lens array assembly 109), while also limiting excess electrons that contribute to space-charge blurring of the beam 120.

In another embodiment, the first lens element 122 is a first electron-optical lens (e.g., electrostatic or electromagnetic lens) maintained at a first voltage and the second lens element 123 is a second electron-optical lens (e.g., electrostatic or electromagnetic lens) maintained at a second voltage, which is different from the first voltage. For example, the first lens element 122 may be a first cylinder maintained at a first voltage and the second lens element 123 may be a second cylinder maintained at a second voltage, which is different from the first voltage. The first lens element 122 and the second lens element 123 may be large bore cylinders (e.g., electron-optical cylindrical lens). The first and second voltages may be determined based on the operating conditions of the system 100. For example, the first lens element 122 may include an electron-optical lens set at a selected voltage (e.g., 30 kV), while the second lens element 123 may include a second electron-optical element set at a selected voltage (e.g., focusing voltage (Vf)) for focusing the beam emanating from the grid element 121 onto the multi-lens array assembly 109.

In another embodiment, the grid lens assembly 103 includes one or more additional electron-optical elements. For example, as shown in FIG. 2, the grid lens assembly 103 may include, but is not limited to, an accelerating element 202 (e.g., electron-optical lens) configured for accelerating the electrons from the multi-lens array assembly 109 to the sample 107.

Figure 3B:
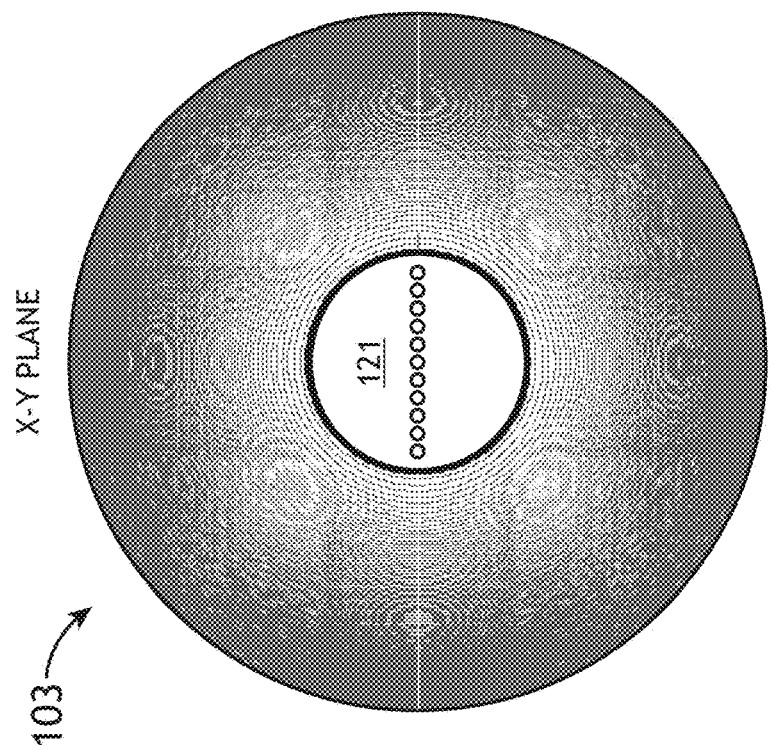
FIG. 3B is a conceptual view of a simulated electron distribution across the area (x-y plane) of the lens elements of the multi-beam source, in accordance with one or more embodiments of the present disclosure.
Figure 3A:
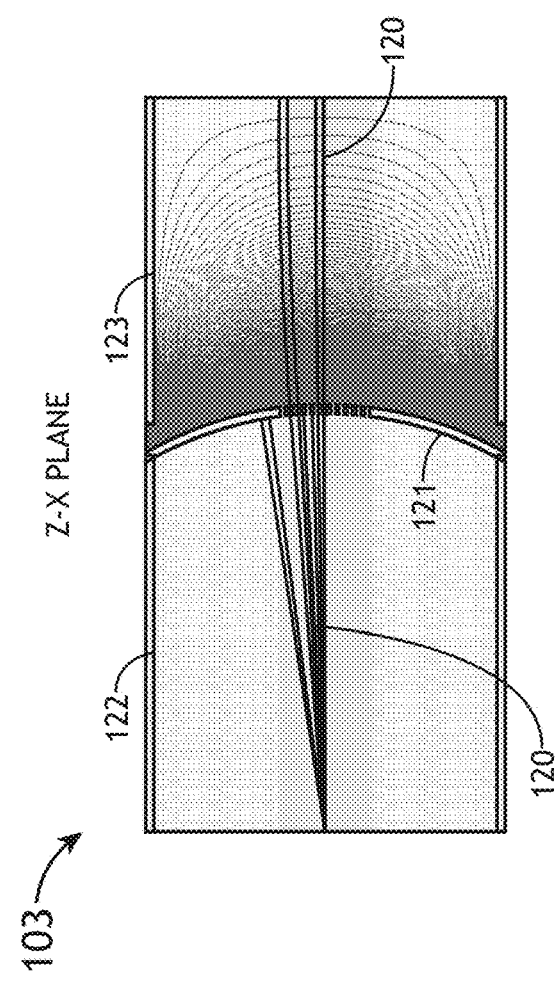
FIG. 3A is a conceptual view of a simulated electron distribution along the length (x-z plane) of the lens elements of the multi-beam source, in accordance with one or more embodiments of the present disclosure.

FIGS. 3A-3B illustrate a conceptual view of a three-dimensional electron distribution associated with the grid lens assembly 103, in accordance with one or more embodiments of the present disclosure. FIG. 3A is a conceptual view of a simulated electron distribution along the length (x-z plane) of the lens elements 122, 123 of the grid lens assembly 103, in accordance with one or more embodiments of the present disclosure. FIG. 3B is a conceptual view of the lens elements 122, 123 of the grid lens assembly 103, in accordance with one or more embodiments of the present disclosure.

Referring again to FIG. 1, the electron source 102 may include any electron source known in the art. For example, the electron source 102 may include, but is not limited to, an electron emitter. For instance, the electron source 102 may include, but is not limited to, an electron gun (e.g., a field emission gun (cathode)).

In another embodiment, the detector assembly 108 is configured to detect electrons emanating from the surface of the sample in response to one or more of the primary electron beams/beamlets 105. The detector assembly 108 of the system 100 may include any detector assembly known in the art suitable for detecting multiple electron signals from the surface of the sample 107. In one embodiment, the detector assembly 108 includes an electron detector array. In this regard, the detector assembly 108 may include an array of electron-detecting portions. Further, each electron-detecting portion of the detector array of the detector assembly 108 may be positioned so as to detect an electron signal from sample 107 associated with one of the incident electron beams 105. In this regard, each channel of the detector assembly 108 corresponds to a particular electron beam of the multiple electron beams 105. The detector assembly 108 may acquire multiple images (or "sub-images"). In this regard, each of the electron beams 105 causes a corresponding electron signal (e.g., secondary electron signal or backscattered electron signal) to form a set of signal beams 117.

The signal beams 117 then form a set of corresponding images, or sub-images, at the detector assembly 108. The images acquired by the detector assembly 108 are then transmitted to the controller 110 for analysis, storage, and/or display to a user.

The detector assembly 108 may include any electron detector known in the art such as, but not limited to, a secondary electron detector and/or a backscattered electron detector. For example, the detector assembly 108 may include a micro-channel plate (MCP), a PIN or p-n junction detector array, such as, but not limited to, a diode array or avalanche photo diodes (APDs). By way of another example, the detector assembly 108 may include a high-speed scintillator/PMT detector.

In another embodiment, the controller 110 is communicatively coupled to the detector assembly 108. The controller 110 may be coupled to the output of the detector assembly 108 in any suitable manner (e.g., by one or more transmission media indicated by the line shown in FIG. 1) such that the controller 110 can receive the output acquired by the detector assembly 108. In one embodiment, the controller 110 includes one or more processors 116 and a memory medium 118 (or memory). The one or more processors 116 are configured to execute a set of program instructions maintained in the memory medium 118 for causing the one or more processors to carry out one or more of the various steps described through the present disclosure.

The sample stage 106 of the system 100 may include any sample stage known in the art suitable for securing sample 107. The sample 107 may include any sample suitable for inspection/review with electron-beam microscopy, such as, but not limited to, a substrate. The substrate may include, but is not limited to, a silicon wafer. In another embodiment, the sample stage 106 is an actuatable stage. For example, the sample stage 106 may include, but is not limited to, one or more translational stages suitable for selectably translating the sample 107 along one or more linear directions (e.g., x-direction, y-direction and/or z-direction). By way of another example, the sample stage 106 may include, but is not limited to, one or more rotational stages suitable for selectively rotating the sample 107 along a rotational direction. By way of another example, the sample stage 106 may include, but is not limited to, a rotational stage and a translational stage suitable for selectably translating the sample along a linear direction and/or rotating the sample 107 along a rotational direction. It is noted herein that the system 100 may operate in any scanning mode known in the art.

The electron-optical assembly 104 may include any electron-optical assembly known in the art suitable for illuminating a sample with multiple electron beams and acquiring multiple images associated with the multiple electron beams. In one embodiment, the electron-optical assembly 104 includes a set of electron-optical elements for directing the multiple electron beams 105 onto the surface of the sample 107. The set of electron-optical elements may form an electron-optical column. The set of electron-optical elements of the column may direct at least a portion of the electron beams 105 onto multiple portions of the sample 107. The set of electron-optical elements may include any electron-optical elements known in the art suitable for focusing and/or directing the primary electron beams 105 onto the various areas of the sample 107. In one embodiment, the set of electron-optical elements includes one or more electron-optical lenses. For example, the one or more electron-optical lenses may include, but are not limited to, one or more condenser lenses (e.g., magnetic condenser lens) for collecting electrons from the multi-lens array assembly 109. By way of another example, the electron-optical lenses may include, but are not limited to, one or more objective lenses 114 (e.g., magnetic objective lens) for focusing the primary electron beams 105 onto the various areas of the sample 107.

In another embodiment, the electron optical assembly 104 includes a set of electron-optical elements for collecting electrons (e.g., secondary electrons and/or backscattered electrons) emanating from the sample 107 in response to the multiple primary electron beams 105 and directing and/or focusing those electrons to the detector assembly 108. For example, the electron optical assembly 104 may include, but is not limited to, one or more projection lenses 115 for focusing the multiple electron signal beams 117 to form multiple images of the various portions of the sample 107 at the detector assembly 108.

It is noted that the electron optical assembly 104 of system 100 is not limited to the electron-optical elements depicted in FIG. 1, which are provided merely for illustrative purposes. It is further noted that the system 100 may include any number and type of electron-optical elements necessary to direct/focus the multiple beams 104 onto the sample 107 and, in response, collect and image the corresponding signal beams 117 onto the detector assembly 108.

For example, the electron-optical assembly 104 may include one or more electron beam scanning elements (not shown). For instance, the one or more electron beam scanning elements may include, but are not limited to, one or more electromagnetic scanning coils or electrostatic deflectors suitable for controlling a position of the beams 105 relative to the surface of the sample 107. Further, the one or more scanning elements may be utilized to scan the electron beams 105 across the sample 107 in a selected pattern.

By way of another example, the electron-optical assembly 104 may include a beam separator (not shown) to separate the multiple electron signals emanating from the surface of the sample 107 from the multiple primary electron beams 105.

Moreover, the electron-optical assembly 104 may include an array of electron-optical columns, whereby each electron-optical column corresponds with one of the primary electron beams 105 and the corresponding signal beams 117. A single electron-beam column is depicted in FIG. 1 for the purposes of simplicity, but the scope of the present disclosure should not be interpreted to be limited to a single electron column. A multi-column SEM architecture is disclosed in U.S. patent application Ser. No. 15/612,862, filed on Jun. 2, 2017; U.S. patent application Ser. No. 15/616,749, filed on Jun. 7, 2017; U.S. patent application Ser. No. 15/969,555, filed on May 2, 2018; and U.S. patent application Ser. No. 15/272,194, filed on Sep. 21, 2016, which are each incorporated herein by reference in their entirety.

The one or more processors 116 of controller 110 may include any processing element known in the art. In this sense, the one or more processors 116 may include any microprocessor-type device configured to execute software algorithms and/or instructions. In one embodiment, the one or more processors 116 may consist of a desktop computer, mainframe computer system, workstation, image computer, parallel processor, or any other computer system (e.g., networked computer) configured to execute a program configured to operate the system 100, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from the non-transitory memory medium 118.

The memory medium 118 may include any storage medium known in the art suitable for storing program instructions executable by the associated one or more processors 116. For example, the memory medium 118 may include a non-transitory memory medium. The memory medium 118 may include, but is not limited to, a read-only memory, a random access memory, a magnetic or optical memory device (e.g., disk), a magnetic tape, a solid state drive and the like. It is noted herein that the memory medium 118 may be configured to store one or more results from the detector assembly 108 and/or the output of one or more of the various steps described herein. It is further noted that memory medium 118 may be housed in a common controller housing with the one or more processors 116. In an alternative embodiment, the memory medium 118 may be located remotely with respect to the physical location of the one or more processors 116. For instance, the one or more processors 116 may access a remote memory (e.g., server), accessible through a network (e.g., internet, intranet and the like).

The embodiments of the system 100 illustrated in FIGS. 1 and 2 may be further configured as described herein. In addition, the system 100 may be configured to perform any other step(s) of any of the method embodiment(s) described herein.

Figure 4:
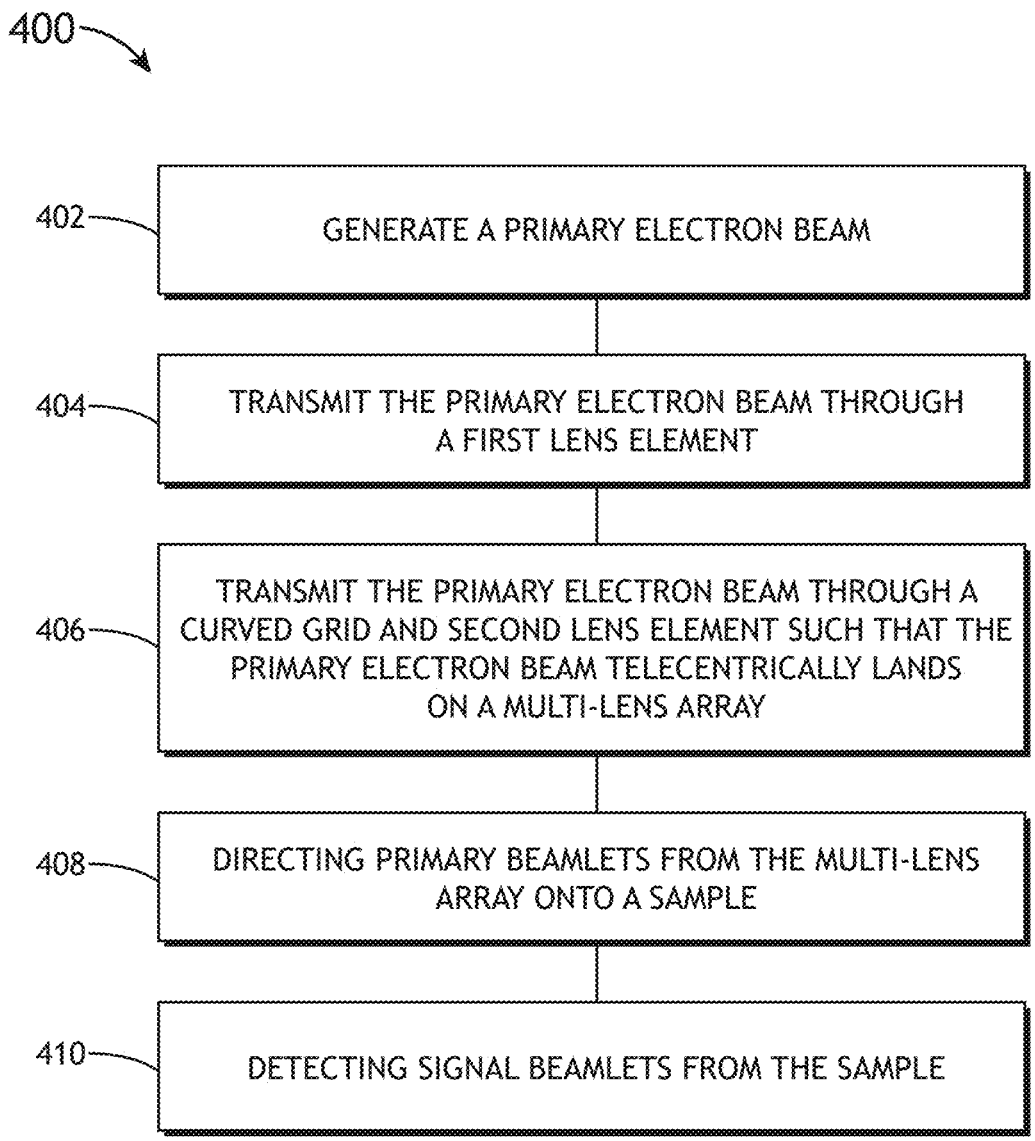
FIG. 4 is a process flow diagram depicting a method of multi-beam scanning electron microscopy, in accordance with one or more embodiments of the present disclosure.

FIG. 4 is a flow diagram illustrating steps performed in a method 400 of multi-beam SEM with telecentric illumination, in accordance with one or more embodiments of the present disclosure. It is noted herein that the steps of method 400 may be implemented all or in part by the system 100. It is further recognized, however, that the method 400 is not limited to the system 100 in that additional or alternative system-level embodiments may carry out all or part of the steps of method 400. In step 402, a primary electron beam is generated. In step 404, the primary electron beam is transmitted through a first lens element. In step 406, the primary electron beam is then transmitted through a curved grid and second lens element such that the primary electron beam telecentrically lands on a multi-lens array. In step 408, a set of primary beamlets from the multi-lens array are directed onto a sample. In step 410, a set of signal beamlets from the sample are detected in response to the plurality of primary beam lets.

All of the methods described herein may include storing results of one or more steps of the method embodiments in the memory medium 118. The results may include any of the results described herein and may be stored in any manner known in the art. After the results have been stored, the results can be accessed in the memory medium and used by any of the method or system embodiments described herein, formatted for display to a user, used by another software module, method, or system, etc. Furthermore, the results may be stored "permanently," "semi-permanently," temporarily, or for some period of time.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A multi-beam scanning electron microscopy apparatus comprising:
   a sample stage configured to secure a sample;
   a multi-beam electron source assembly configured to form a plurality of primary electron beams, wherein the multi-beam electron source assembly comprises an electron source, a grid lens assembly, and a multi-lens array assembly, wherein the multi-lens array assembly comprises a plurality of lenses disposed across a substrate, wherein the grid lens assembly comprises:
   a first lens element and a second lens element, wherein the first lens element and the second lens element are separated by a gap of a selected distance; and a curved grid element including a plurality of apertures, wherein the curved grid element is disposed within the gap between the first lens element and the second lens element, wherein the first lens element, the second lens element, and the curved grid element cause an electron beam from the electron source to land on the multi-lens array assembly telecentrically with uniform angular illumination across the plurality of lenses of the multi-lens array assembly, wherein the curved grid element further masks electrons from the electron beam source attributable to beam degradation through at least one of Coulomb or electron-electron interactions, wherein the plurality of lenses of the multi-lens array assembly generate a plurality of primary electron beams with a uniform distribution based on the uniform angular illumination from the grid lens assembly;

an electron-optical column assembly including a set of electron-optical elements configured to direct at least a portion of the plurality of primary electron beams onto a portion of the sample; and a detector assembly configured to detect electrons emanating from a surface of the sample in response to one or more primary electron beams of the plurality of primary electron beams.

2. The apparatus of claim 1, wherein the first lens element is maintained at a first voltage and the second lens element is maintained at a second voltage different from the first voltage.

3. The apparatus of claim 1, wherein at least one of the first lens element or the second lens element comprises at least one of an electrostatic or an electromagnetic lens.

4. The apparatus of claim 1, wherein the first lens element comprises a cylinder and the second lens element comprises a cylinder.

5. The apparatus of claim 1, wherein the curved grid element comprises a curved grid including an array of apertures.

6. The apparatus of claim 5, wherein the curved grid has a shape corresponding to a truncated Bessel function.

7. The apparatus of claim 1, wherein at least one of the first lens element or the second lens element comprises a large bore cylindrical electron-optical lens.

8. The apparatus of claim 1, wherein the multi-beam electron source assembly further comprises: an accelerating electron-optical element configured to receive and accelerate one or more primary electron beams of the uniform distribution of primary electric beams from the multi-lens array assembly.

9. The apparatus of claim 1, wherein the plurality of lenses of the multi-lens array assembly are separated by a selected pitch in one or more directions.

10. The apparatus of claim 1, wherein the electron-optical column assembly comprises: an array of electron-optical columns.

11. The apparatus of claim 1, wherein the detector assembly comprises at least one of a secondary electron detector or a backscattered electron detector.

12. A multi-beam electron source comprising:
an electron source;
a multi-lens array assembly, wherein the multi-lens array assembly comprises a plurality of lenses disposed across a substrate; and a curved grid lens assembly, wherein the curved grid lens assembly comprises:
a first lens element and a second lens element, wherein the first lens element and the second lens element are separated by a gap of a selected distance; and
a grid element including a plurality of apertures, wherein the grid element is disposed within the gap between the first lens element and the second lens element,
wherein the first lens element, the second lens element, and the grid element cause an electron beam from the electron source to land on the multi-lens array assembly telecentrically with uniform angular illumination across the plurality of lenses of the multi-lens array assembly, wherein the grid element further masks electrons from the electron beam source attributable to beam degradation through at least one of Coulomb or electron-electron interactions,
wherein the plurality of lenses of the multi-lens array assembly generate a plurality of primary electron beams with a uniform distribution based on the uniform angular illumination from the grid lens assembly.

13. The multi-beam electron source of claim 12, wherein the first lens element is maintained at a first voltage and the second lens element is maintained at a second voltage different from the first voltage.

14. The multi-beam electron source of claim 12, wherein at least one of the first lens element or the second lens element comprises at least one of an electrostatic or an electromagnetic lens.

15. The multi-beam electron source of claim 12, wherein the first lens element comprises a cylinder and the second lens element comprises a cylinder.

16. The multi-beam electron source of claim 12, wherein the curved grid element comprises a curved grid including an array of apertures.

17. The multi-beam electron source of claim 16, wherein the curved grid has a shape corresponding to a truncated Bessel function.

18. The multi-beam electron source of claim 12, wherein at least one of the first lens element or the second lens element comprises a large bore cylindrical electron-optical lens.

19. The multi-beam electron source of claim 12, further comprising: an accelerating electron-optical element configured to receive and accelerate one or more primary electron beams of the uniform distribution of primary electron beams from the multi-lens array assembly.

20. The multi-beam electron source of claim 12, wherein the plurality of lenses of the multi-lens array assembly are separated by a selected pitch in one or more directions.

21. A method comprising:
generating a primary electron beam;
transmitting the primary electron beam through a first lens element; and
transmitting the primary electron beam through a curved grid element and second lens element, wherein the first lens element, the second lens element, and the curved grid element cause an electron beam from the electron source to land on a multi-lens array assembly telecentrically with uniform angular illumination across the plurality of lenses of the multi-lens array assembly, wherein the curved grid element further masks electrons from the electron beam source attributable to beam degradation through at least one of Coulomb or electron-electron interactions; such that the primary electron beam telecentrically lands on the multi-lens array assembly;

generating a plurality of primary electron beams with a uniform distribution based on the uniform angular illumination from a grid lens assembly with the multi-lens array assembly;

directing the plurality of primary electron beams emanating from the multi-lens array assembly onto a sample; and detecting a plurality of signal beam lets from the sample in response to the plurality of primary electron beams.

* * * * *